United States Patent [19]
ElHatem et al.

[11] Patent Number: 5,600,149
[45] Date of Patent: Feb. 4, 1997

[54] POWER SUPPLY REGULATOR

[75] Inventors: Abdul M. ElHatem, Redondo Beach, Calif.; Mohammad M. Mojarradi, Pullman, Wash.; Masaji Sato, Torrance, Calif.

[73] Assignee: Xerox Corporation, Stamford, Conn.

[21] Appl. No.: 550,478

[22] Filed: Oct. 30, 1995

[51] Int. Cl.$^6$ .............................. H03K 3/42; G02B 27/00
[52] U.S. Cl. ............................................ 250/551; 327/514
[58] Field of Search ................................ 250/551, 214 R;
327/514, 369, 419, 427, 431, 432, 478, 566; 307/31, 33, 34; 323/265, 268, 270

[56] References Cited

U.S. PATENT DOCUMENTS

| | | | |
|---|---|---|---|
| 4,357,544 | 11/1982 | May et al. | 307/34 |
| 4,682,061 | 7/1987 | Donovan | 327/434 |
| 4,766,471 | 8/1988 | Ovshinsky et al. | 257/57 |
| 5,381,018 | 1/1995 | Mojaradi et al. | 250/551 |
| 5,382,826 | 1/1995 | Mojaradi et al. | 257/489 |

*Primary Examiner*—Edward P. Westin
*Assistant Examiner*—John R. Lee
*Attorney, Agent, or Firm*—Fariba Rad

[57] ABSTRACT

An improved optically controlled power supply regulator in which an optoisolator transistor is controlled by an input light emitting diode replaces an optically controlled power supply regulator with a light emitting diode controlled with a light dependent resistor. The optically controlled power supply regulator utilizes a capacitor and a resistor to reduce loop response oscillation in order to prevent the optically controlled power supply regulator from being shut down on a system board.

4 Claims, 6 Drawing Sheets

5,600,149

POWER SUPPLY REGULATOR

BACKGROUND

This invention relates generally to high voltage transistor applications and more particularly concerns an improved optically controlled power supply regulator in which an optoisolator transistor is controlled by an input light emitting diode to turn on a series of high voltage MOSFETs for use in applications currently using a high voltage light dependent resistor (LDR) controlled with a light emitting diode (LED).

FIG. 1 shows an existing light emitting diode controlled with a light dependent resistor. A light emitting diode or LED 10 is positioned to shine light rays 12 onto a light dependent resistor or LDR 14. The LDR 14 is mounted on a substrate 16. When the LED 10 shines light rays 12 on the LDR 14, resistance of the LDR 14 changes. The resistance of the LDR 14 is linearly dependent on the intensity of the light rays 12.

Typically, optically controlled power supply regulators utilize a LDR. Unfortunately, the response time of a LDR is long and the device is not stable. In addition, the existing LDRs have a life span of 1½ year which increases the cost of ownership since the parts have to be replaced frequently. Furthermore, the material (cadmium sulfide) used in the existing LDRs are not environmentally friendly.

U.S. Pat. No. 5,381,018 titled "Electronic Circuit to replace a Light Emitting Diode and a Light Dependent Resistor" has disclosed a circuit which utilizes an optoisolator transistor controlled by an input light emitting diode to replace an existing LDR. In the U.S. Pat. No, 5,381,018, the disclosed circuit is utilized as an optically variable impedance.

In this application, the disclosed circuit of U.S. Pat. No. 5,381,018 is utilized as an optically controlled power supply regulator which is faster than the existing optically controlled power supply regulators with LDR.

However, once the circuit of U.S. Pat. No. 5,381,018 is utilized as an optically controlled power supply and placed on a system board, it shuts down. A system board is a board which is connected to a high voltage power supply to regulate the operation of the power supply in order to deliver proper current and voltage to xerographic process.

Accordingly, it is the primary aim of this invention to provide a replacement circuit for a power supply regulator using LED/LDR device. It is also an object of this invention to provide a replacement optically controlled power supply regulator which is stable, has faster response times, has a long life span, has significantly lower cost of ownership and is environmentally friendly. It is further an object of this invention to utilize the circuit disclosed in U.S. Pat. No. 5,381,018 as the bases for the optically controlled power supply regulator of this invention and improve the subject circuit in order to overcome the shut down problem.

Further advantages of the invention will become apparent as the following description proceeds.

SUMMARY OF THE INVENTION

Briefly stated and in accordance with the present invention, there is provided an optically controlled power supply regulator which utilizes optoisolator transistor controlled by an input light emitting diode. In this invention, a resistor and a capacitor is utilized to reduce the loop response oscillation of each optically controlled power supply regulator of a system board to prevent a shut down problem.

While the present invention will be described in connection with a preferred embodiment, it will be understood that it is not intended to limit the invention to that embodiment. On the contrary, it is intended to cover all alternatives, modifications and equivalents as may be included within the spirit and scope of the invention as defined by the appended claims.

DETAILED DESCRIPTION OF THE INVENTION

Figure 2:
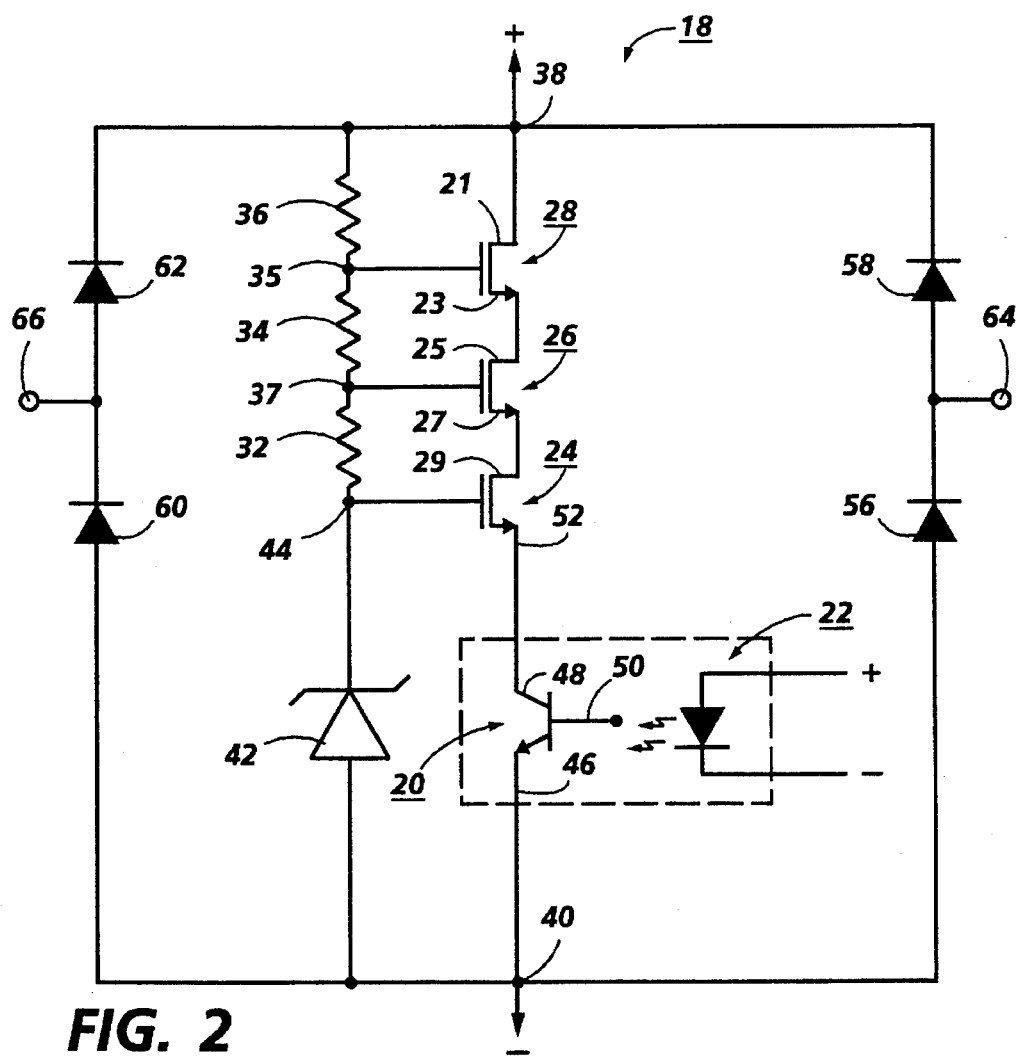
FIG. 2 is a schematic of an optically controlled power supply regulator using an optoisolator transistor.

Referring to FIG. 2, there is shown an optically controlled power supply regulator 18 comprising an optoisolator transistor 20 controlled by an input LED 22. The optoisolator transistor 20 is used to turn on and off a series of high voltage MOSFETs 24, 26, 28. The series of high voltage MOSFETs 24, 26, 28 are connected in a cascaded fashion with bias resistors 32, 34, 36. The positive node for the cascaded high voltage MOSFETs 24, 26, 28 and bias resistors 32, 34, 36 subcircuit is node 38 and the negative node, with respect to node 38, is node 40.

In the series of MOSFETs 32, 34, 36, the drain 21 of the MOSFET 28 is connected to the positive node 38 and the source 23 of MOSFET 28 is connected to the drain 25 of MOSFET 26. In the same manner, the source 27 of MOSFET 26 is connected to the drain 29 of MOSFET 24. The gate 35 of MOSFET 28 is connected to the gate 37 of the MOSFET 26 through the resistor 34 and the gate 37 of the MOSFET 26 is also connected to the gate 44 of the MOSFET 24 through the resistor 32. The gate 35 of the MOSFET 28 is also connected to the positive node 38 through the resistor 36.

The optically controlled power supply regulator 18 also includes a zener diode 42. The cathode of the Zener diode 42 is connected to the gate 44 of the high voltage MOSFET 24 and the anode of the zener diode 42 is connected to the emitter 46 of the optoisolator transistor 20 and to the negative node 40. The zener diode 42 is used to produce a bias voltage for collector 48 of the optoisolator transistor 20 which insures that optoisolator transistor 20 will be operating in its active region and not drift into its saturation region. Zener diode 42 also provides the correct bias voltage to the input gate 44 of the high voltage MOSFET 24 to insure that high voltage MOSFET 24 stays turned on.

The emitter 46 of the optoisolator transistor 20 is connected to node 40 and the base 50 is left floating. "Floating" as used herein shall mean that the base 50 is neither connected to any power supply nor is it grounded.

The series of high voltage MOSFETs 24, 26, 28 are connected to the optoisolator transistor 20 by connecting the source 52 of the high voltage MOSFET 24 to the optoisolator transistor 20 at its collector 48. The other electrical end (drain of MOSFET 28) of the series of high voltage MOSFETs 24, 26, 28 becomes the positive node 38 of the optically controlled power supply regulator 18. The electrical connections of the zener diode 42 and the emitter 46 of the optoisolator transistor 20 are connected together as the negative node 56 of the optically controlled power supply regulator 18.

In addition, there are four diodes connected between nodes 38 and 40. The cathode of diode 56 is connected to the anode of diode 58 and the cathode of diode 58 is connected to node 38 while the anode of diode 56 is connected to node 40. Also, the cathode of diode 60 is connected to the anode of diode 62 and the cathode of diode 62 is connected to node 38 while the anode of diode 60 is connected to node 40. In this configuration, the node 64 between the cathode of diode 56 and anode of diode 58 and the node 66 between the cathode of diode 60 and anode of diode 62 are the inputs to the optically controlled power supply regulator 18. Inputs 64 and 66 can receive either a negative DC voltage, a positive DC voltage or an AC voltage such as ±3000 V DC or 3000 V AC. Depending on the received input diodes 56, 58, 60 and 62 will rectify the input voltage and apply the rectified voltage to nodes 38 and 40.

Figure 1:
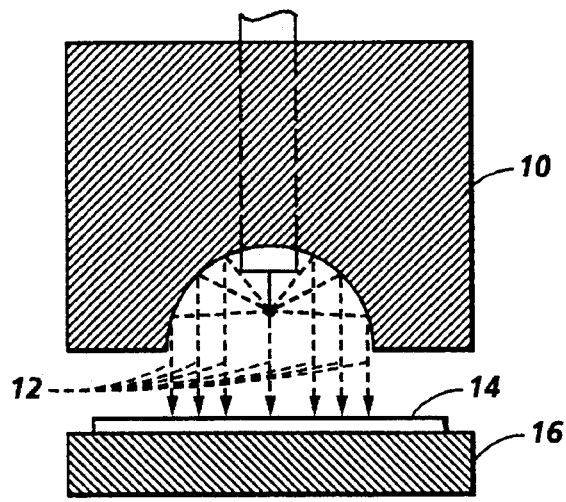
FIG. 1 is a side view of an LED/LDR.

In operation, either the positive node 38 or the negative node 40 is fixed at a given potential. For analysis, assume the positive node 38 is fixed at a given potential $V_d$. The current flowing through the high voltage MOSFETs 24, 26, and 28 causes a voltage drop between the node 38 and the source 52 of the MOSFET 24 which is called $V_{DS}$ (the voltage between the drain 38 of MOSFET 28 and the source 52 of the MOSFET 24). $V_{GS}$ (the voltage between the gate 35 of the (MOSFET 28 and the source 52 of the (MOSFET 24) is set by the zener diode 42. However, the current through the MOSFETs 24, 26, and 28 and the voltage ($V_{DS}$) across the (MOSFETs 24, 26, and 28 are controlled by the optoisolator transistor 20. Therefore, the current through the MOSFETS 24, 26 and 28 and the VDS, can be regulated by adjusting the driving current of the optoisolator transistor 20 through the input LED 22. The optical isolator transistor 20, and therefore the optically controlled power supply regulator 18, respond more quickly than the conventional LED/LDR shown in FIG. 1.

While optoisolator transistor 20 in FIG. 2 is shown implemented with a bipolar transistor it could also be implemented using a MOSFET. The primary difference in operation between implementing the optoisolator transistor 20 with a MOSFET or a bipolar transistor is that a Bipolar transistor has an intrinsic gain not present in a MOSFET transistor.

Figure 4:
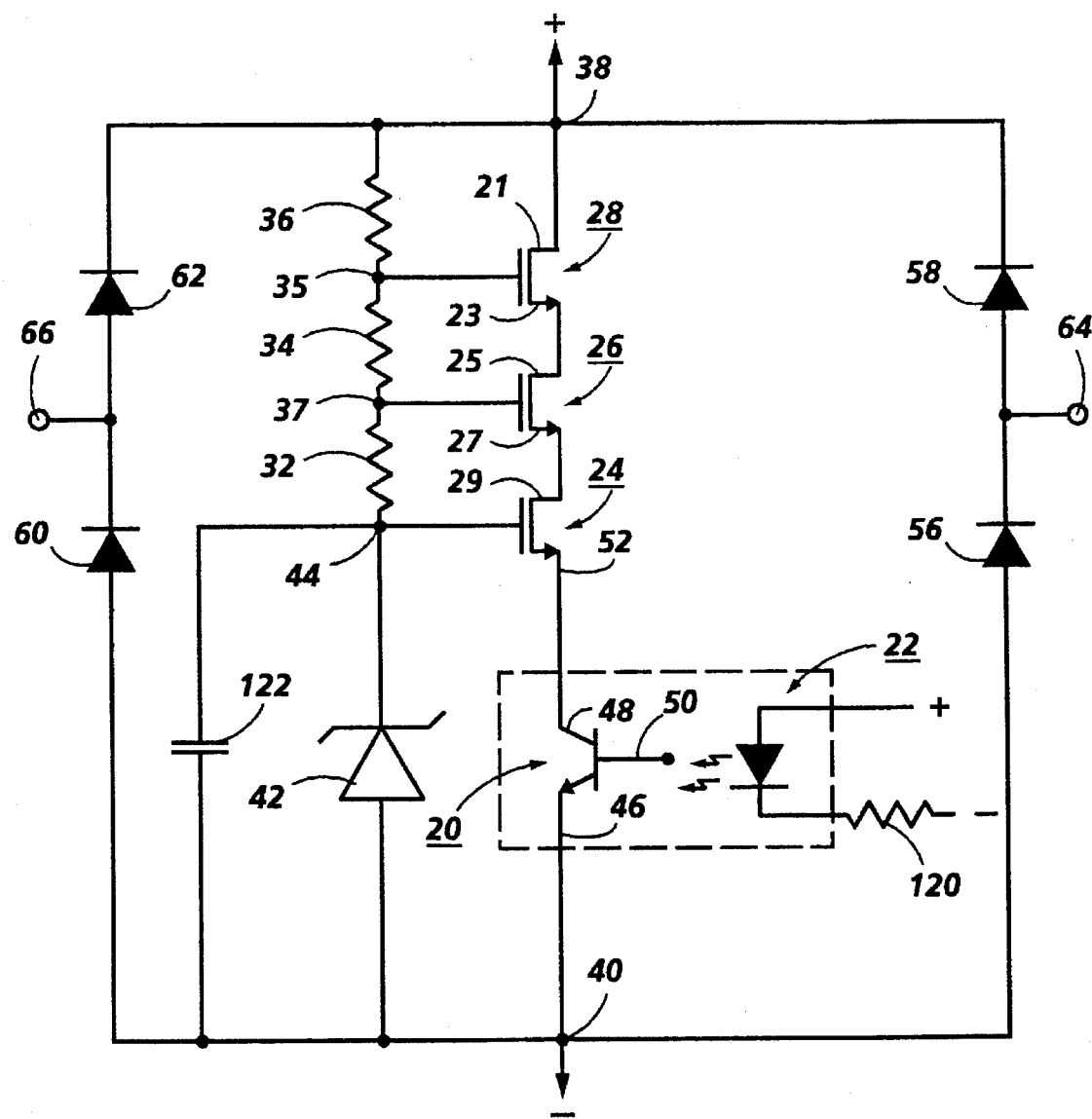
FIG. 4 is a schematic of an improved optically controlled power supply regulator using an optoisolator transistor.
Figure 5:
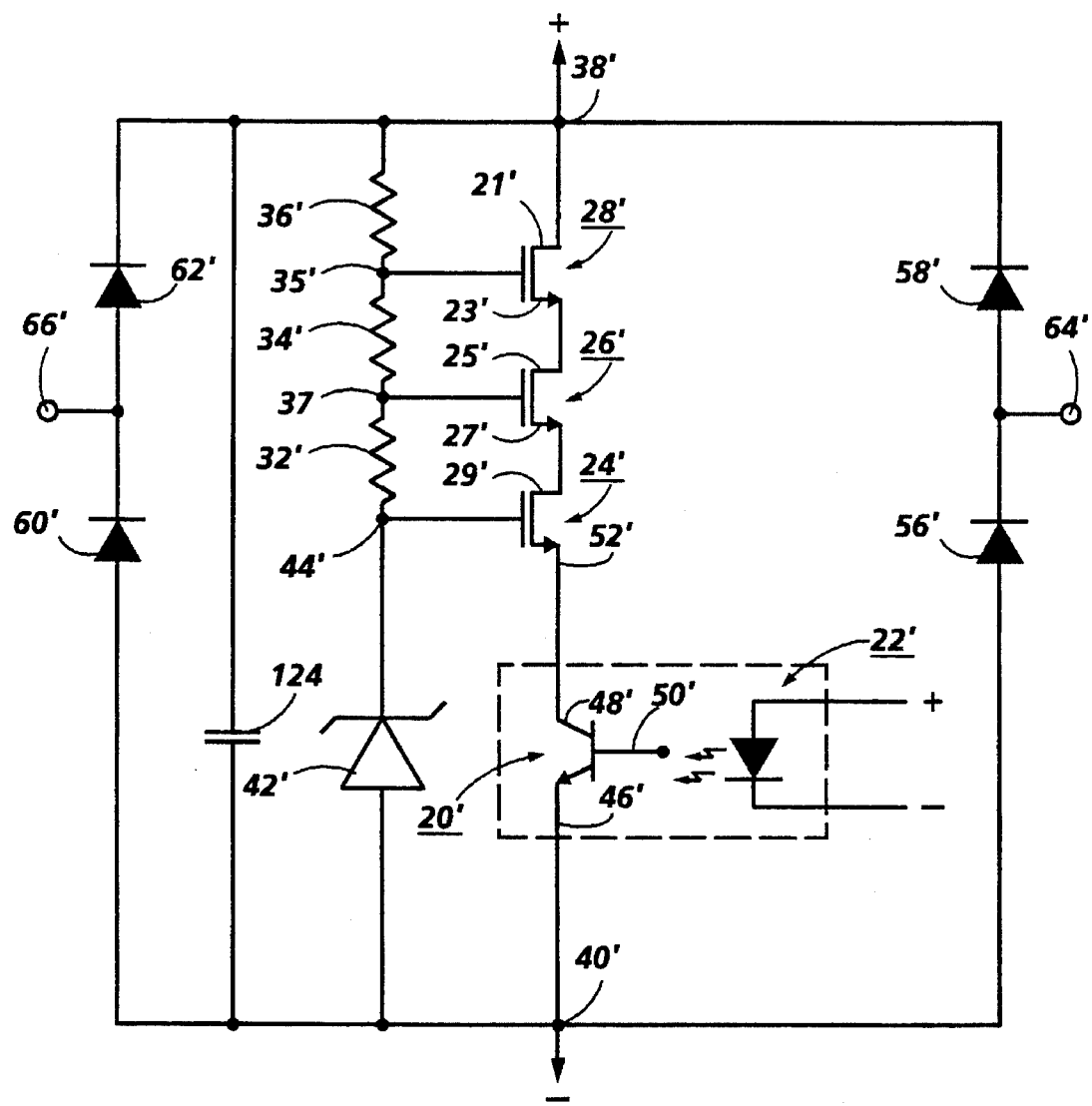
FIG. 5 is a schematic of an alternative improved optically controlled power supply regulator using an optoisolator transistor.

It should be noted that in FIGS. 2, 4 and 5, three MOSFETs are utilized. However, depending on the voltage requirements, the number of transistors can be increased or decreased.

It should also be noted that, the circuits of FIG. 2 can be further improved to set the voltage across gate to source of each MOSFET individually by dedicating an individual zener diode to each MOSFET which will be connected between the gate and the source of each MOSFET.

The circuit shown in FIG. 2 requires further improvement since once it is placed on a system board, it creates loop response oscillation and it shuts down. Loop response oscillation is a phenomenon which is caused by the feed back loops of the system board. The feed back loops give the signal an oscillation ripple much greater than the ripples for which the system board has been designed to handle. For example for a 0.5 watt device, the loop response oscillation ripple is greater than 3% of operating voltage vs the desired range which is less than 1%. The ripples caused by the loop response oscillation can create conditions of unstable output that can cause print defects on paper.

Figure 3:
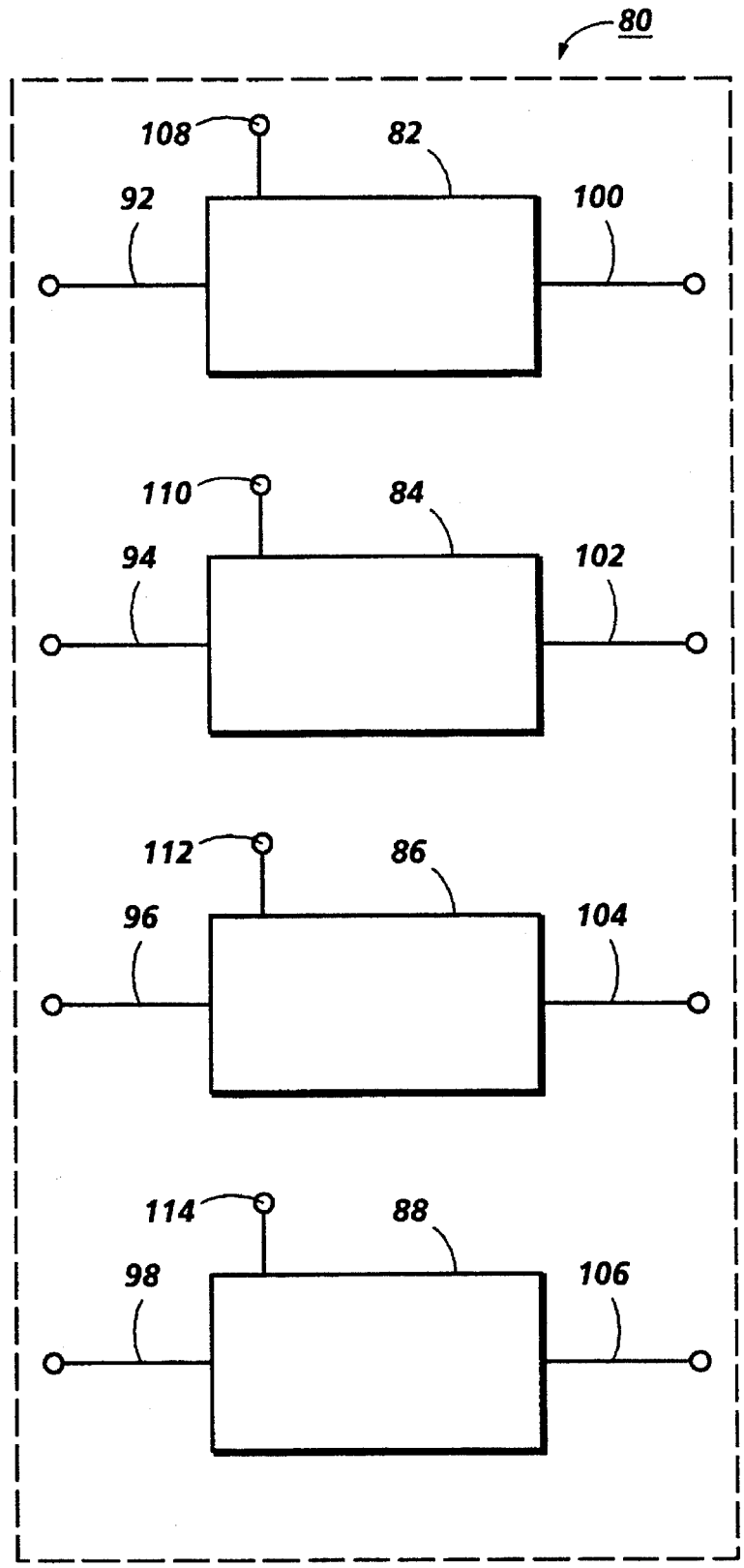
FIG. 3 is a simplified block diagram of a system board.

Referring to FIG. 3, there is shown a simplified block diagram of a system board 80. Typically, a system board utilizes multiple power regulators to regulate both current and voltage of a power supply. System board 80 has four blocks 82, 84, 86 and 88. Blocks 82 and 84 are voltage regulators and blocks 86 and 88 are current regulators. Each one of the blocks 82, 84, 86 and 88 receives a different input via lines 92, 94, 96 and 98 respectively.

Blocks 82 and 84 each regulates the voltage of its respective input to a different voltage range. Block 82, which receives a −2.5 KV DC input, regulates its input voltage to a range between −250 V to −1500 V and sends it out on the output line 100. In which case, the output current will be at a range between 50 uA to −100 uA. However, block 84 which receives a −1.5 KV DC input, regulates its input voltage to a range the range between −50 V to −400 V and sends it out on the output line 102. In which case, the output current will be at a range between 0 to −25 uA.

Blocks 86 and 88 each regulates the current of its respective input to a different current range. Block 86, which receives a +2.5 KV DC input, regulates its input current to a range between 5 uA to 100 uA and sends it out on the output line 104. In which case, the output voltage will be at a range between 10 V to 2000 V. However, block 88, which receives a −2.0 KV DC input, regulates its input current to a range between −15 uA to −21 uA and sends it out on the output line 106. In which case, the output voltage will be at a range between −500 V to −2000 V.

Typically each one of the blocks 82, 84, 86 and 88 comprises an optically controlled power supply regulator. In addition, each one of the blocks 82, 84, 86 and 88 has a separate control signal 108, 110, 112 and 114 respectively. Each control signal defines the range of its corresponding optically controlled power supply regulator. The control signals 108, 110, 112 and 114 are programmable by a processor and therefore, each control signal can be modified individually in order to modify the range of its corresponding regulator output.

During the operation of system board 80, the optically controlled power supply regulator of blocks 82, 84, 86 and 88 each causes a loop response oscillation ripple. The loop response oscillation was traced to module gain of each optically controlled variable impedance circuit.

Referring to FIG. 4, in order to reduce the module gain of the optically controlled power supply regulator, a resistor 120 was connected in series with the negative terminal of the input LED 22 of FIG. 3. It should be noted that those elements which are the same as disclosed in the description of FIG. 2 are designated by the same reference numerals. This resistor 120 reduced the loop response oscillation ripples for the optically controlled power supply regulator of block 82 to a desired range. However, the added resistor 120 at the input in blocks 84, 86 and 88 reduced the loop response oscillation ripples, but not to the desired level. Therefore, the loop response oscillation had to be further reduced.

By trial and error, it was determined that by adding a capacitive element to the high impedance nodes, the loop response oscillation can be further reduced. As a result, a capacitor 122 was added to the high impedance nodes which are the input gate 44 of the MOSFET 24 and the negative node 40.

The combination of resistor 120 and capacitor 122, reduces the loop response oscillation to the desired level in all the blocks 102, 104, 106 and 108 of FIG. 3.

Therefore, the circuit of FIG. 4 is the circuit which can replace an optically controlled power supply regulator with LED/LDR device. The optically controlled power supply of this invention which has faster response time, is less sensitive to the temperature change and has an acceptable loop response oscillation.

Referring to FIG. 5, there is shown an alternative embodiment of this invention. It should be noted that in FIG. 5, those elements which are the same as disclosed in the description of FIG. 2 are designated by the same reference numerals with a prim "'" affixed thereto. In FIG. 5, the capacitor 122 of FIG. 4 and the resistor 120 of FIG. 4 are replaced by capacitor 124. Capacitor 124 is capable of reducing the loop response oscillation to a desired level in all four regulators 82, 84, 86, and 88. However, the value of capacitor 124 is in the range between 108 PF–680 PF. Capacitor 124 is a high voltage capacitor, very bulky and very expensive.

Therefore, the embodiment shown in FIG. 4 is the preferred embodiment of this invention and is more cost effective.

Figure 6:
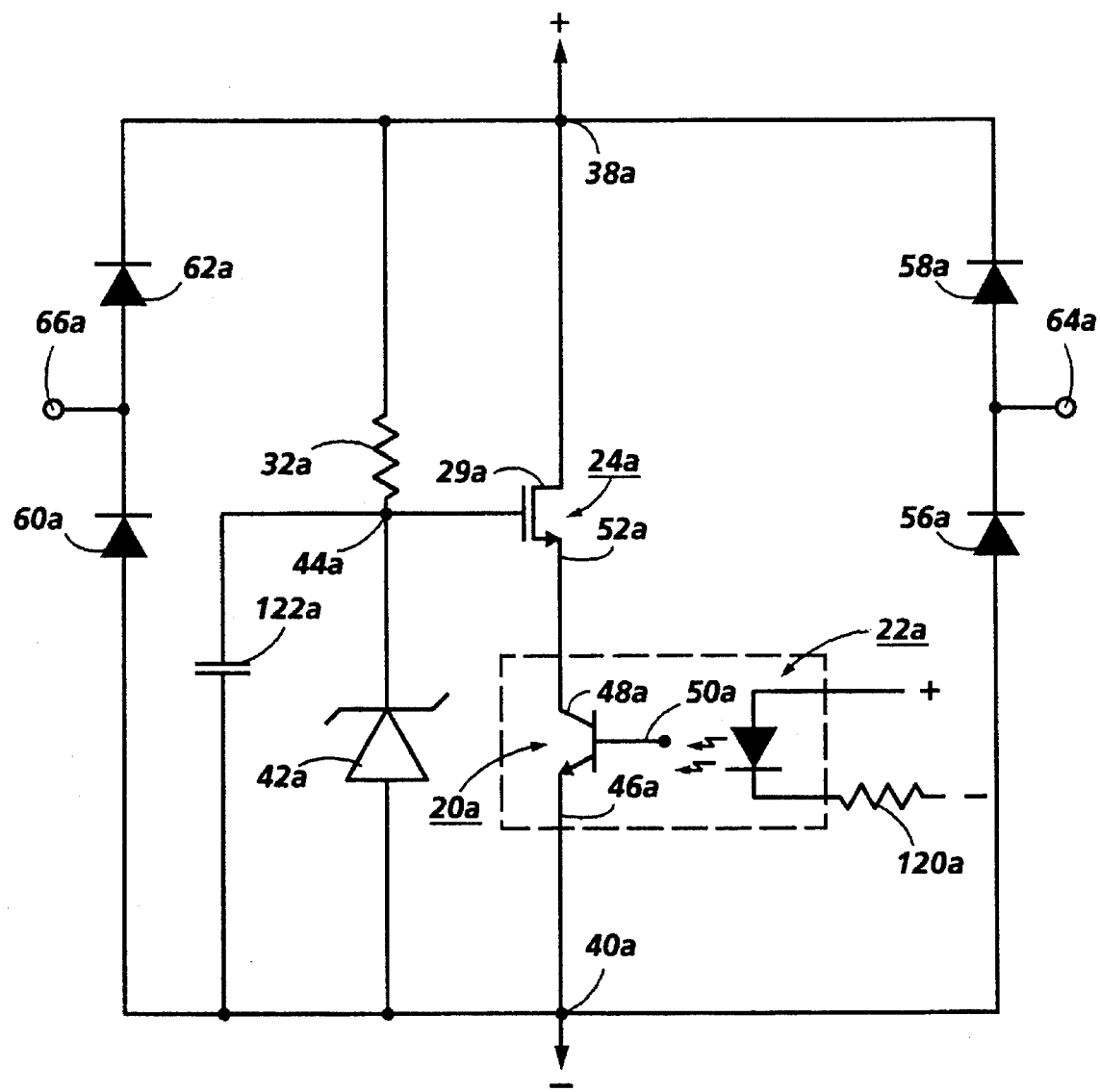
FIG. 6 is a schematic of the optically controlled power supply regulator of FIG. 4 using only one MOSFET.

Referring to FIG. 6, there is shown the optically controlled power supply regulator of FIG. 4 with only one MOSFET. In FIG. 6, those elements which are the same as disclosed in the description of FIG. 4 are designated by the same reference numerals with an "a" affixed thereto.

It should be noted that the embodiment shown in FIG. 6 has a limited voltage range such as ±1000 V DC. However, if higher voltages are required, the number of MOSFETs can be increased.

Figure 7:
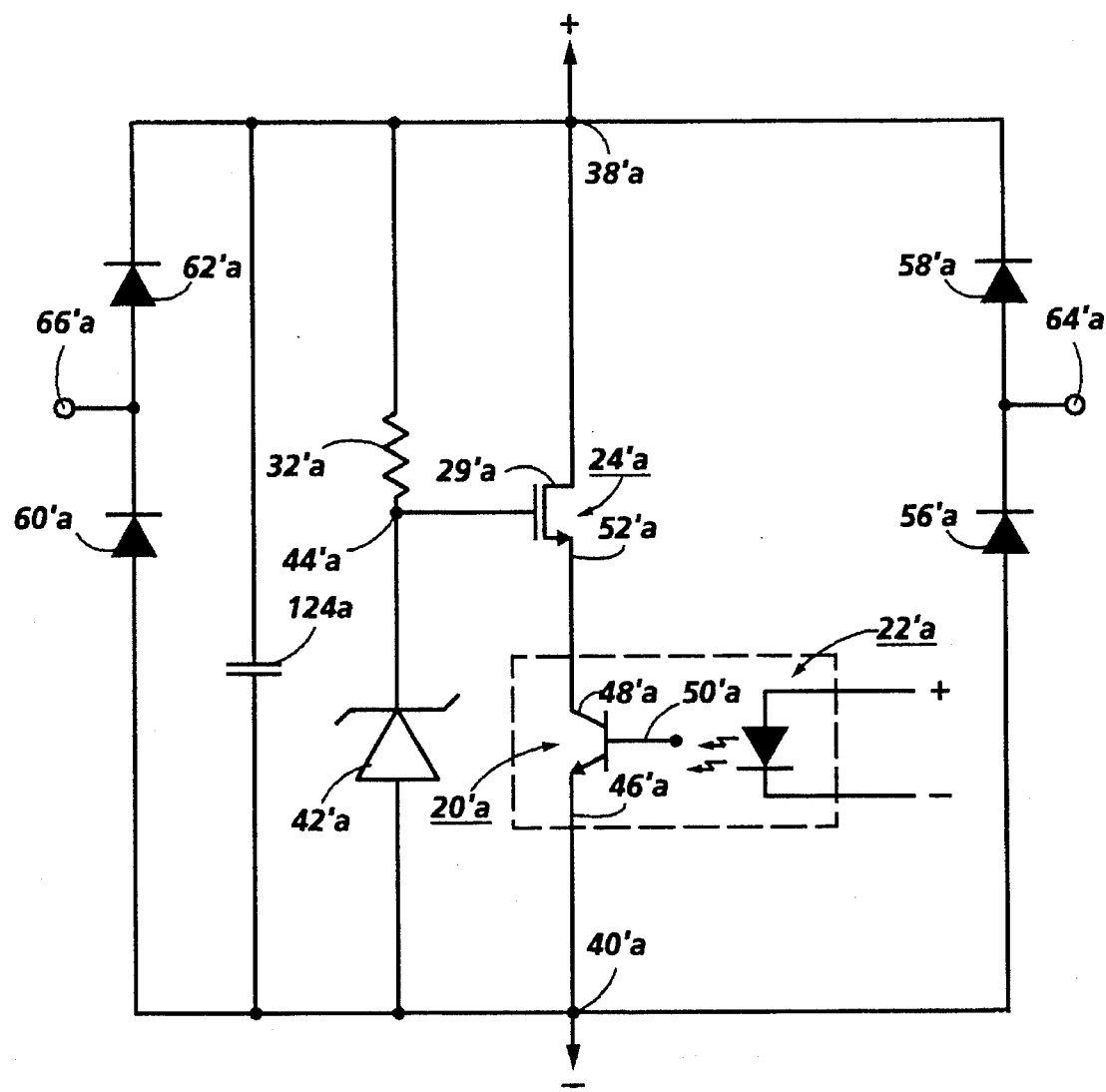
FIG. 7 is a schematic of the optically controlled power supply regulator of FIG. 5 using only one MOSFET.

In addition, referring to FIG. 7, there is shown the optically controlled power supply regulator of FIG. 5 with only one MOSFET. In FIG. 7, those elements which are the same as disclosed in the description of FIG. 5 are designated by the same reference numerals with an "a" affixed thereto.

It should be noted that the embodiment shown in FIG. 7 has a limited voltage range such as +1000 V DC. However, if higher voltages are required, the number of MOSFETs can be increased.

The optically controlled power supply regulator of FIGS. 4 and 5 are highly stable and have a long life span of 10 to 15 years which reduces the cost of ownership by factor of 30. Also, they use silicon which is environmentally friendly.

We claim:

1. An optically controlled power supply regulator comprising:

a transistor means having a gate, a drain, and a source;

a resistive means;

biasing means having a positive terminal and a negative terminal;

an optoelectronic transistor means having a collector, an emitter which outputs emitter current, and a base;

a positive node at a given voltage;

a negative node at a given voltage that is less than the positive node voltage;

said drain of said transistor means being electrically connected to said positive node;

said source of said transistor means being electrically connected to said collector of said optoelectronic transistor means;

said gate of said transistor means being electrically connected to said positive node through said resistive means;

said gate of said also being electrically connected to said positive terminal of said biasing means;

said emitter of said optoelectronic transistor being electrically connected to said negative terminal of said biasing means and to said negative node;

said base is floating;

a light emitting means having a negative terminal and a positive terminal;

said emitter being responsive to light from said light emitting means for changing the amount of emitter current; and the improvement comprising:

a capacitive means being electrically connected between said gate of said transistor means and said negative node and a resistive means being electrically connected to said light emitting means at said negative terminal and being in series with said light emitting means.

2. An optically controlled power supply regulator comprising:

a plurality of transistor means each having a gate, a drain, and a source;

said plurality of transistor means being electrically connected to each other in a cascade series;

a plurality of of resistive means;

biasing means having a positive terminal and a negative terminal;

an optoelectronic transistor means having a collector, an emitter which outputs emitter current, and a base;

a positive node at a given voltage;

a negative node at a given voltage that is less than the positive node voltage;

said plurality of transistor means in series having a first transistor means in the series and having a last transistor means in the series;

said drain of said first transistor means in the series being electrically connected to said positive node;

said source of said last transistor means in the series being electrically connected to said collector of said optoelectronic transistor means;

said source of each one of said plurality of transistor means other than said last transistor being electrically connected to said drain of the following transistor means;

said gate of each one of said plurality of transistor means other than said last transistor means being electrically connected to said gate of the following transistor means through a respective one of said plurality of resistive means;

said gate of said first transistor means also being electrically connected to said positive node through one of said plurality of resistive means;

said gate of said last transistor means being electrically connected to said positive terminal of said biasing means;

said emitter of said optoelectronic transistor being electrically connected to said negative terminal of said biasing means and to said negative node;

said base is floating;

a light emitting means having a negative terminal and a positive terminal;

said emitter being responsive to light from said light emitting means for changing the amount of emitter current; and the improvement comprising:

a capacitive means being electrically connected between said gate of said last transistor means and said negative node and a resistive means being electrically connected to said light emitting means at said negative terminal and being in series with said light emitting means.

3. An optically controlled power supply regulator comprising:

a transistor means having a gate, a drain, and a source;

a resistive means;

biasing means having a positive terminal and a negative terminal;

an optoelectronic transistor means having a collector, an emitter which outputs emitter current, and a base;

a positive node at a given voltage;

a negative node at a given voltage that is less than the positive node voltage;

said drain of said transistor means being electrically connected to said positive node;

said source of said transistor means being electrically connected to said collector of said optoelectronic transistor means;

said gate of said transistor means being electrically connected to said positive node through said resistive means;

said gate of said also being electrically connected to said positive terminal of said biasing means;

said emitter of said optoelectronic transistor being electrically connected to said negative terminal of said biasing means and to said negative node;

said base is floating;

a light emitting means having a negative terminal and a positive terminal;

said emitter being responsive to light from said light emitting means for changing the amount of emitter current; and the improvement comprising:

a capacitive means being electrically connected between said positive node and said negative node.

4. An optically controlled power supply regulator comprising:

a plurality of transistor means each having a gate, a drain, and a source;

said plurality of transistor means being electrically connected to each other in a cascade series;

a plurality of of resistive means;

biasing means having a positive terminal and a negative terminal;

an optoelectronic transistor means having a collector, an emitter which outputs emitter current, and a base;

a positive node at a given voltage;

a negative node at a given voltage that is less than the positive node voltage;

said plurality of transistor means in series having a first transistor means in the series and having a last transistor means in the series;

said drain of said first transistor means in the series being electrically connected to said positive node;

said source of said last transistor means in the series being electrically connected to said collector of said optoelectronic transistor means;

said source of each one of said plurality of transistor means other than said last transistor being electrically connected to said drain of the following transistor means;

said gate of each one of said plurality of transistor means other than said last transistor means being electrically connected to said gate of the following transistor means through a respective one of said plurality of resistive means;

said gate of said first transistor means also being electrically connected to said positive node through one of said plurality of resistive means;

said gate of said last transistor means being electrically connected to said positive terminal of said biasing means;

said emitter of said optoelectronic transistor being electrically connected to said negative terminal of said biasing means and to said negative node;

said base is floating;

a light emitting means having a negative terminal and a positive terminal;

said emitter being responsive to light from said light emitting means for changing the amount of emitter current; and the improvement comprising:

a capacitive means being electrically connected between said positive node and said negative node.

* * * * *